(12) United States Patent
Aleksandrowicz

(10) Patent No.: US 9,805,822 B1
(45) Date of Patent: Oct. 31, 2017

(54) BUILT-IN SELF-TEST FOR ADAPTIVE DELAY-LOCKED LOOP

(71) Applicant: Marvell Israel (M.I.S.L) Ltd., Yokneam (IL)

(72) Inventor: Dan Aleksandrowicz, Modi'in (IL)

(73) Assignee: MARVELL ISRAEL (M.I.S.L) LTD., Yokneam (IL)

( * ) Notice: Subject to any disclaimer, the term of this patent is extended or adjusted under 35 U.S.C. 154(b) by 0 days.

(21) Appl. No.: 15/412,093

(22) Filed: Jan. 23, 2017

Related U.S. Application Data

(60) Provisional application No. 62/301,902, filed on Mar. 1, 2016.

(51) Int. Cl.
*G11C 7/00* (2006.01)
*G11C 29/02* (2006.01)
*H03L 7/099* (2006.01)

(52) U.S. Cl.
CPC .......... *G11C 29/023* (2013.01); *G11C 29/028* (2013.01); *H03L 7/0997* (2013.01)

(58) Field of Classification Search
USPC ........... 365/201, 194, 233.1, 233.5; 327/270, 327/231, 256, 257
See application file for complete search history.

(56) References Cited

U.S. PATENT DOCUMENTS

| | | | |
|---|---|---|---|
| 6,348,826 B1 * | 2/2002 | Mooney | G01R 31/3016 327/231 |
| 9,093,127 B1 * | 7/2015 | Solt | G06F 1/206 |
| 2014/0184243 A1 * | 7/2014 | Iyer | G01R 31/31708 324/620 |

* cited by examiner

*Primary Examiner* — Vu Le

(57) ABSTRACT

An electronic circuit includes an adaptive delay circuit and a test circuit. The adaptive delay circuit is configured to receive an input clock signal, to further receive a delay setting that specifies first and second delays, and to generate first and second delayed versions of the input clock signal that are delayed relative to the input clock signal by the first and second delays, respectively. The test circuit is configured to test the adaptive delay circuit by (i) programming the adaptive delay circuit with multiple different delay settings that each specifies a respective first delay and a respective second delay, (ii) for each of the multiple delay settings, measuring an actual time offset between the first and second delayed versions of the input clock signal, and (iii) generating a test result based on actual time offsets measured for the multiple different delay settings.

13 Claims, 2 Drawing Sheets

BUILT-IN SELF-TEST FOR ADAPTIVE DELAY-LOCKED LOOP

CROSS-REFERENCE TO RELATED APPLICATIONS

This application claims the benefit of U.S. Provisional Patent Application 62/301,902, filed Mar. 1, 2016, whose disclosure is incorporated herein by reference.

FIELD OF THE DISCLOSURE

The present disclosure relates generally to self-testing of electronic circuitry, and particularly to methods and devices for self-testing of Adaptive Delay-Locked Loop (ADLL) circuits.

BACKGROUND

Some Integrated Circuits (IC), such as memory devices, generate clock signals using Adaptive Delay-Locked Loop (ADLL) circuitry. ADLLs are useful, for example, for generating clock signals in a manner that is insensitive to Process, Voltage and Temperature (PVT) variations.

The description above is presented as a general overview of related art in this field and should not be construed as an admission that any of the information it contains constitutes prior art against the present patent application.

SUMMARY

An embodiment that is described herein provides an electronic circuit including an adaptive delay circuit and a test circuit. The adaptive delay circuit is configured to receive an input clock signal, to further receive a delay setting that specifies first and second delays, and to generate first and second delayed versions of the input clock signal that are delayed relative to the input clock signal by the first and second delays, respectively. The test circuit is configured to test the adaptive delay circuit by (i) programming the adaptive delay circuit with multiple different delay settings that each specifies a respective first delay and a respective second delay, (ii) for each of the multiple delay settings, measuring an actual time offset between the first and second delayed versions of the input clock signal, and (iii) generating a test result based on actual time offsets measured for the multiple different delay settings.

In some embodiments, the test circuit includes a Digital Ring Oscillator (DRO) that is configured to count the actual time offset. In an embodiment, the test circuit is configured to derive, from the first and second delayed versions of the input clock signal, a pulse having a width that is indicative of the actual time offset, and to trigger the DRO with the pulse.

In some embodiments, the test circuit is configured to define at least a subset of the delay settings to all have a same phase offset between the first and second delays. In an example embodiment, the test circuit is configured to output a failure result in response to detecting that the actual time offsets, measured for the subset of the delay settings, differ from one another by more than a specified difference. In a disclosed embodiment, the adaptive delay circuit includes a multi-tap delay line, and the test circuit is configured to set the phase offset between the first and second delays to a delay of a single tap of the multi-tap delay line. In some embodiments, a memory device includes the disclosed electronic circuit.

There is additionally provided, in accordance with an embodiment that is described herein, a method for testing an adaptive delay circuit. The method includes operating an adaptive delay circuit, which is configured to receive an input clock signal, to further receive a delay setting that specifies first and second delays, and to generate first and second delayed versions of the input clock signal that are delayed relative to the input clock signal by the first and second delays, respectively. The adaptive delay circuit is tested by (i) programming the adaptive delay circuit with multiple different delay settings that each specifies a respective first delay and a respective second delay, (ii) for each of the multiple delay settings, measuring an actual time offset between the first and second delayed versions of the input clock signal, and (iii) generating a test result based on actual time offsets measured for the multiple different delay settings.

The present disclosure will be more fully understood from the following detailed description of the embodiments thereof, taken together with the drawings in which:

DETAILED DESCRIPTION OF EMBODIMENTS

Figure 1:
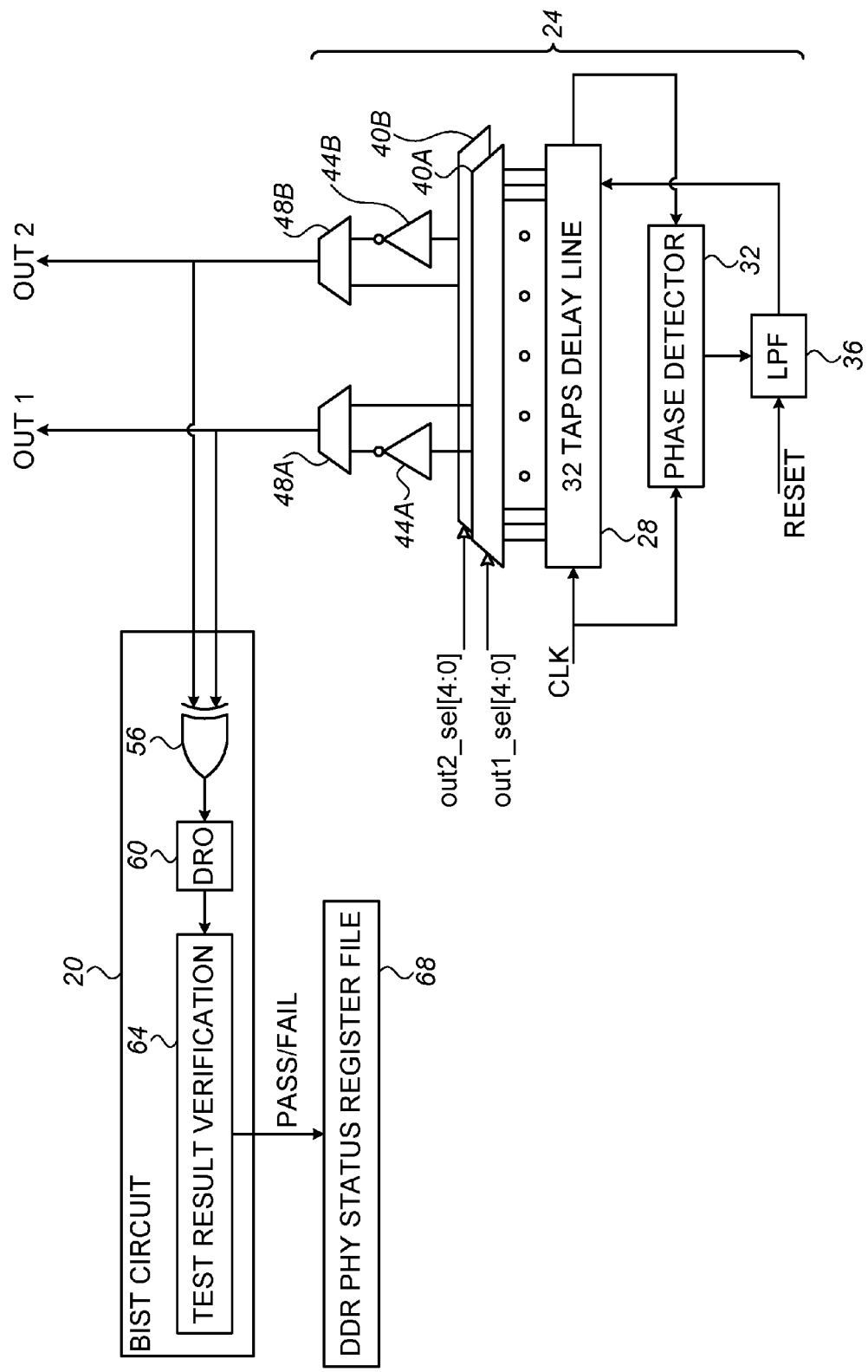
FIG. 1 is a block diagram that schematically illustrates a Built-In Self-Test (BIST) circuit for an Adaptive Delay-Locked Loop (ADLL) circuit, in accordance with an embodiment that is described herein.

Embodiments that are described herein provide methods and devices for self-testing of Adaptive Delay-Locked Loop (ADLL) circuitry. The embodiments described herein refer mainly to ADLL circuits in Dual Data Rate (DDR) Dynamic Random Access Memory (DRAM) devices, but the disclosed techniques are useful in any other suitable Integrated Circuit (IC) that comprises an ADLL.

In the disclosed embodiments, the ADLL circuit is configured to generate two delayed versions of an input clock signal. The ADLL circuit is programmed with a programmable delay setting that specifies the two delays to be applied. In one example embodiment, each of the two delays is selectable from a set of thirty-two possible delays that span an end-to-end delay of a quarter of a clock cycle. In an embodiment, an ADLL circuit of this sort is implemented using a 32-tap delay line and a pair of programmable output multiplexers.

In this sort of ADLL design, the hardware path between the input clock signal and the outputs that provide the delayed versions is challenging to test and verify with an external tester, e.g., due to the relatively coarse measurement granularity of the external tester.

In some embodiments, testing of the hardware path described above is accomplished by a Built-In Self-Test (BIST) circuit that is fabricated in the same IC as the ADLL circuit. The BIST circuit is configured to program the ADLL circuit with multiple different delay settings, each specifying a respective pair of delays to be applied to the input clock signal. For each of these delay settings, the BIST circuit measures the actual time offset between the two delayed versions of the input clock signal, which are generated by the ADLL circuit. The BIST signal generates a test result, e.g., pass or fail, based on the actual time offsets measured for the multiple different delay settings.

In one example implementation, the BIST circuit measures the actual time offsets between the delayed versions of the input clock signal using an eXclusive OR (XOR) gate that triggers a Digital Ring Oscillator (DRO). The XOR gate XORs the two delayed versions of the input clock signal together, and thus generates a pulse whose width corresponds to the actual time offset between the delayed versions. The DRO is triggered by the pulse, i.e., enabled to run for the duration of the pulse and thus count the actual time offset. Following the pulse, the digital word at the output of the DRO is thus indicative of the actual time offset between the delayed versions of the input clock signal. The BIST circuit verifies the multiple digital words generated for the multiple different delay settings, to decide whether the ADLL circuit indeed applies the correct delays in response to the delay settings.

In an example embodiment, the multiple delay settings specify the same predefined phase difference between the delayed versions of the input clock signal, but differ in absolute delays. In this embodiment, the BIST circuit checks whether all the actual time offsets between the delayed versions are sufficiently similar to one another. If not, the ADLL circuit is regarded failed. In this example test, although not necessarily, the BIST circuit does not compare the actual time offsets to any absolute time offset that is considered correct, but to one another.

Since the disclosed BIST configurations are not dependent on the absolute delay of the delay line, but rather on differences between different delay-line taps, they are insensitive to Process, Voltage and Temperature (PVT) variations. By testing multiple different delay settings, the disclosed BIST configurations are able to cover any desired range of possible failure modes of the ADLL circuit, and are therefore highly effective in detecting failures and deviations from specified performance. At the same time, the above test performance is achieved with minimal additional on-chip hardware.

FIG. 1 is a block diagram that schematically illustrates a Built-In Self-Test (BIST) circuit 20 for testing an Adaptive Delay-Locked Loop (ADLL) circuit 24, in accordance with an embodiment that is described herein.

In an example embodiment, ADLL circuit 24 is part of physical-layer (PHY) circuitry that generates clock signals in a memory device, e.g., a Dual Data Rate (DDR) Dynamic Random Access Memory (DRAM). In this embodiment, BIST circuit 20 is fabricated as part of the memory device and is configured to self-test ADLL circuit 24. In alternative embodiments, BIST circuit 20 may be part of any other suitable electronic circuit, for testing any other suitable type of ADLL.

In the embodiment of FIG. 1, ADLL circuit 24 comprises a 32-tap delay line 28, a phase detector 32, a Low-Pass Filter (LPF) 36, and two programmable multiplexers (MUXs) 40A and 40B. ADLL circuit 24 receives an input clock signal (denoted CLK in the figure), and is configured to generate two delayed versions of this clock signals. The delayed versions are provided as output (outputs denoted OUT1 and OUT2 in the figure). The frequency of the input clock signal in the present example is between 300 MHz and 1 GHz.

In an embodiment, delay line 28 outputs thirty-two delayed versions of the input clock signal. The delay of a single tap of the delay line, i.e., the delay increment between successive delayed versions, is ⅟₃₂ of 90° of a clock cycle, and the overall delay range covered by the thirty-two delayed versions is thus a quarter of a clock cycle.

Phase detector 32 receives two inputs—the input of delay line 28 (the input clock signal) and the output of delay line 28 (the input clock signal delayed by quarter of a clock cycle)—and generates a signal that is indicative of the phase between them. The output of phase detector 32 is filtered by LPF 36, and the LPF output is fed back to delay line 28. The feedback enables the circuit to detect a full 180° delay of the clock signal, for calibrating the tap delays. Using this feedback loop, the thirty-two delayed versions generated by delay line 28 remain phase-locked on the input clock signal.

In an embodiment, MUX 40A receives the thirty-two delayed versions of the input clock signal, and a 5-bit control word denoted out1_sel, and outputs one of the delayed versions as specified by the control word. Similarly, MUX 40B receives the thirty-two delayed versions of the input clock signal, and a 5-bit control word denoted out2_sel, and outputs one of the delayed versions as specified by the control word. In the present context, the pair of 5-bit values {out1_sel,out2_sel} provided to ADLL circuit 24 is referred to herein as a "delay setting" that specifies the two delays to be applied to the input clock signal.

The delayed version of the input clock signal, which is selected by MUX 40A, is provided as OUT1 after passing through an inverter 44A and a MUX 48A. Similarly, the delayed version of the input clock signal, which is selected by MUX 40B, is provided as OUT2 after passing through an inverter 44B and a MUX 48B. In this embodiment, MUXs 40A and 40B enable the ADLL circuit whether to select a positive or inverted delay.

In some embodiments, BIST circuit 20 is configured to test the entire hardware path of ADLL circuit 24, between the input clock signal and outputs OUT1 and OUT2. This hardware path is also referred to herein as an "adaptive delay circuit." In the present example, BIST circuit 20 comprises a XOR gate 56, a Digital Ring Oscillator (DRO) 60 and a result verification logic 64.

For a given delay setting, XOR gate 56 performs a XOR operation between the signals OUT1 and OUT2, i.e., between the two delayed versions of the input clock signal. The output of XOR gate 56 (in some embodiments after gating) is thus a pulse whose width corresponds to the actual time offset between the delayed versions. The pulse output by XOR gate 56 is used for triggering DRO 60. In one example, the pulse is provided as an "override enable" signal to the DRO. In this manner, DRO 60 is enabled to run for the duration of the pulse and thus count the actual time offset. Following the pulse, the digital word at the output of DRO 60 is indicative of the actual time offset between the delayed versions of the input clock signal.

In an embodiment, logic 64 carries out a test sequence that programs ADLL circuit with various delay settings ({out1_sel,out2_sel} pairs) and, for each delay setting, measures the actual time offset between the delayed versions of the input clock signal. Logic 64 records the actual time offsets measured for the various delay settings, and uses these results to decide whether the ADLL circuit is functional or faulty. The test results (e.g., pass/fail) are stored in a status register file 68 of the DDR DRAM device.

The configurations of ADLL circuit 24 and BIST circuit 20 described in FIG. 1 are example configurations that are depicted solely for the sake of clarity. In alternative embodiments, any other suitable ADLL and/or BIST circuit configuration can be used. For example, in an embodiment, the same IC comprises multiple ADLL circuits similar to circuit 24, e.g., a master ADLL circuit and a slave ADLL circuit, and a single BIST circuit 20 is used for testing both ADLL circuits. In an example implementation of this sort, BIST circuit 20 comprises a separate XOR gate 56 for each ADLL circuit, and an additional MUX that routes the output of the desired XOR gate to DRO 60. A configuration of this sort is described in U.S. Provisional Patent Application 62/301,902, cited above.

Circuit elements that are not mandatory for understanding of the disclosed techniques have been omitted from the figure for the sake of clarity. The different ADLL and/or BIST circuit elements may be implemented using dedicated hardware or firmware, such as using hard-wired or programmable logic, e.g., in one or more Application-Specific Integrated Circuits (ASICs) or Field-Programmable Gate Arrays (FPGAs). Some elements of BIST circuit 20 may be implemented using software, or using a combination of hardware, software and/or firmware elements.

In some embodiments, some elements of BIST circuit 20, e.g., some or all of the functionality of logic 64, are implemented in a programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Figure 2:
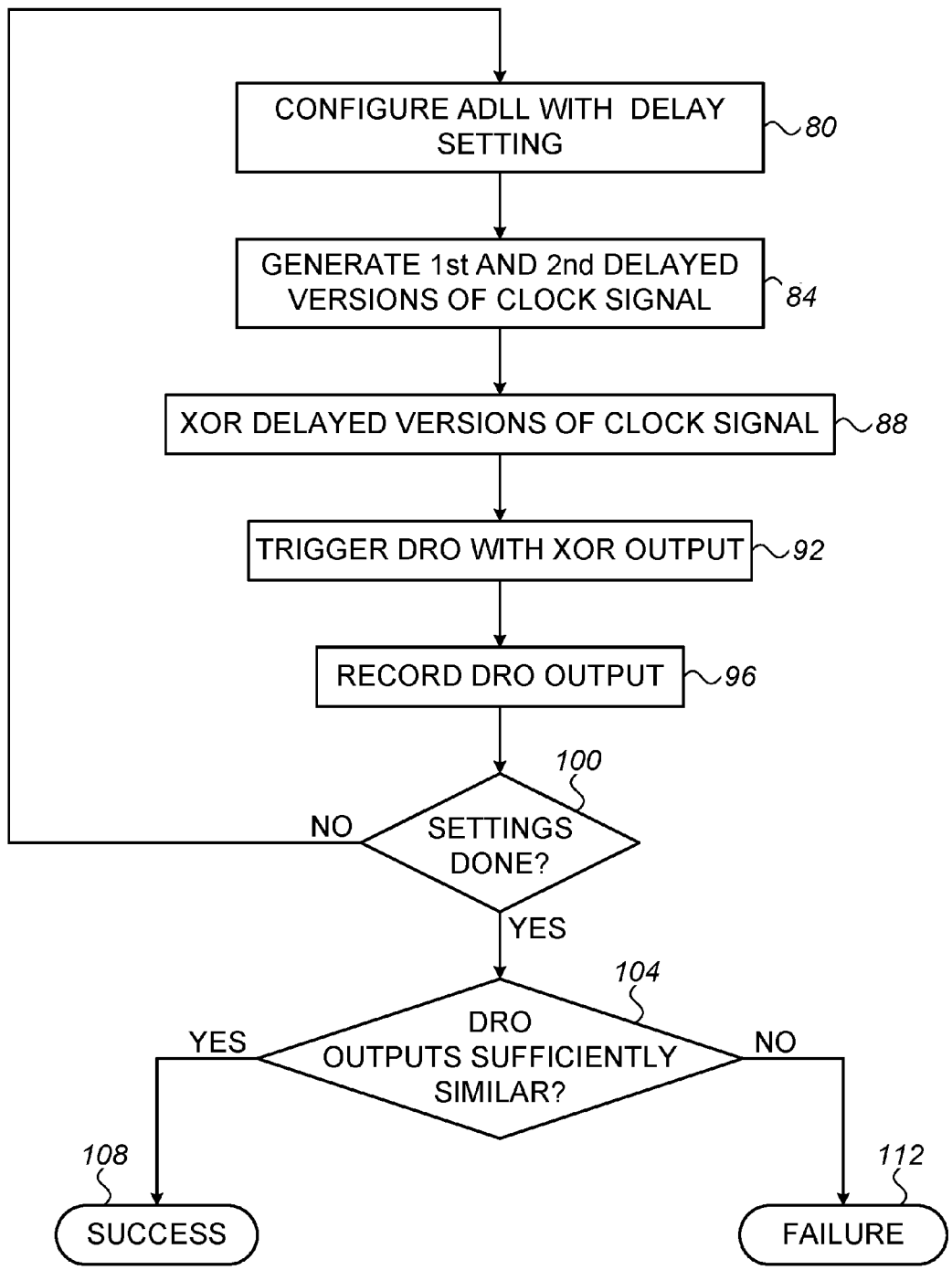
FIG. 2 is a flow chart that schematically illustrates a method for self-testing the ADLL circuit of FIG. 1, in accordance with an embodiment that is described herein.

FIG. 2 is a flow chart that schematically illustrates a method, carried out by BIST circuit 20, for self-testing ADLL circuit 24, in accordance with an embodiment that is described herein.

In the present example, BIST circuit 20 evaluates a sequence of multiple delay settings, which all specify the same predefined phase difference between the delayed versions of the input clock signal, but differ in absolute delays. The BIST circuit then checks whether all the actual time offsets between the delayed versions are sufficiently similar to one another.

In an example embodiment, BIST circuit 20 checks whether any of the actual time offsets between the delayed versions differ by more than a predefined time threshold. If so, the ADLL circuit is regarded failed. In one example embodiment, the ADLL divides a quarter of a clock cycle (90°) of a 4.8 GHz clock signal into thirty-two segments, i.e., 208 pS/(4*32)≈1.625 pS per tap of delay element 28. A DRO pulse for such a time period will result in the DRO outputting digital words whose 2-3 Least Bits (LSBs) vary, but the remaining Most Significant Bits (MSBs) remain the same. In this example, the delayed versions are sufficiently similar to one another if they differ at most in their 2-3 LSBs. In alternative embodiments, any other suitable threshold can be used for this purpose. This sort of test is insensitive to PVT variations, especially when the entire sequence is carried out within a short time period during which the temperature is stable.

For example, in one embodiment each delay setting specifies a pair of adjacent delays, i.e., delays that are offset by a single tap of delay line 28. If ADLL circuit 24 is functional, the actual time offsets between the delayed versions should be very similar to one another across all the delay settings.

More generally, it is sufficient that at least a subset of the delay settings have the same predefined phase difference between their first and second delays. In addition to this subset, additional delay settings that do not meet this condition may also be tested.

The method of FIG. 2 begins with logic 64 in BIST circuit 20 programming ADLL circuit 24 with a delay setting, at a delay configuration operation 80. At an output generation operation 84, ADLL circuit 24 generates the two delayed versions of the input clock signal in accordance with the programmed delay setting. At a XOR operation 88, XOR gate 56 XORs the two delayed versions of the input clock signal. At a DRO triggering operation 92, DRO 60 is triggered by the output of XOR gate 56, and runs for a time duration corresponding to the actual time offset between the two delayed versions of the input clock signal. At a result recording operation 96, logic 64 records at least part of the digital word at the output of DRO 60.

At a completion checking operation 100, logic 64 checks whether all intended delay settings have been tested. If not, the method loops back to operation 80 above, in which logic 64 programs ADLL circuit 24 with the next delay setting to be tested.

Once all the desired delay settings have been tested, logic 64 checks whether the DRO outputs obtained for the multiple different delay settings are sufficiently similar to one another. In other words, logic 64 checks whether the actual time offsets between the two delayed versions of the input clock signal are sufficiently similar to one another, across the various delay settings. As noted above, in some embodiments logic 64 checks whether any of the actual time offsets between the delayed versions differ by more than a predefined time threshold.

In an embodiment, logic 64 checks whether the DRO outputs for the different delay settings differ from one another by less than a predefined difference. In an embodiment, logic 64 does not compare the entire digital words output by the DRO, but only a predefined number of Most Significant Bits (MSBs) of the DRO outputs.

If the DRO outputs for the multiple different delay settings are sufficiently similar to one another, logic 64 records a "pass" result in register file 68, at a success termination operation 108. If not, logic 64 records a "fail" result in register file 68, at a failure termination operation 112.

The method of FIG. 2 is an example method, which is depicted solely for the sake of conceptual clarity. In alternative embodiments, BIST circuit 20 may run any other suitable kind of test sequence that applies any other suitable set of delay settings, and may analyze the DRO outputs in any other suitable way to decide whether ADLL circuit 24 is functional or faulty.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:
1. An electronic circuit, comprising:
an adaptive delay circuit, configured to receive an input clock signal, to further receive a delay setting that specifies first and second delays, and to generate first and second delayed versions of the input clock signal that are delayed relative to the input clock signal by the first and second delays, respectively; and
a test circuit, configured to test the adaptive delay circuit by:

programming the adaptive delay circuit with multiple different delay settings that each specifies a respective first delay and a respective second delay;

for each of the multiple delay settings, measuring an actual time offset between the first and second delayed versions of the input clock signal; and generating a test result based on actual time offsets measured for the multiple different delay settings.

2. The electronic circuit according to claim 1, wherein the test circuit comprises a Digital Ring Oscillator (DRO) that is configured to count the actual time offset.

3. The electronic circuit according to claim 2, wherein the test circuit is configured to derive, from the first and second delayed versions of the input clock signal, a pulse having a width that is indicative of the actual time offset, and to trigger the DRO with the pulse.

4. The electronic circuit according to claim 1, wherein the test circuit is configured to define at least a subset of the delay settings to all have a same phase offset between the first and second delays.

5. The electronic circuit according to claim 4, wherein the test circuit is configured to output a failure result in response to detecting that the actual time offsets, measured for the subset of the delay settings, differ from one another by more than a specified difference.

6. The electronic circuit according to claim 4, wherein the adaptive delay circuit comprises a multi-tap delay line, and wherein the test circuit is configured to set the phase offset between the first and second delays to a delay of a single tap of the multi-tap delay line.

7. A memory device comprising the electronic circuit of claim 1.

8. A method for testing an adaptive delay circuit, the method comprising:

operating an adaptive delay circuit, which is configured to receive an input clock signal, to further receive a delay setting that specifies first and second delays, and to generate first and second delayed versions of the input clock signal that are delayed relative to the input clock signal by the first and second delays, respectively; and testing the adaptive delay circuit, by:

programming the adaptive delay circuit with multiple different delay settings that each specifies a respective first delay and a respective second delay;

for each of the multiple delay settings, measuring an actual time offset between the first and second delayed versions of the input clock signal; and generating a test result based on actual time offsets measured for the multiple different delay settings.

9. The method according to claim 8, wherein measuring the actual time offset comprises counting the actual time offset using a Digital Ring Oscillator (DRO).

10. The method according to claim 9, wherein measuring the actual time offset comprises deriving, from the first and second delayed versions of the input clock signal, a pulse having a width that is indicative of the actual time offset, and triggering the DRO with the pulse.

11. The method according to claim 8, wherein testing the adaptive delay circuit comprises defining at least a subset of the delay settings to all have a same phase offset between the first and second delays.

12. The method according to claim 11, wherein generating the test result comprises outputting a failure result in response to detecting that the actual time offsets, measured for the subset of the delay settings, differ from one another by more than a specified difference.

13. The method according to claim 11, wherein the adaptive delay circuit comprises a multi-tap delay line, and wherein defining the subset of the delay settings comprises setting the phase offset between the first and second delays to a delay of a single tap of the multi-tap delay line.

* * * * *